United States Patent [19]
Yamashita et al.

[11] Patent Number: 5,507,930
[45] Date of Patent: Apr. 16, 1996

[54] METHOD OF SPUTTERING A CARBON PROTECTIVE FILM ON A MAGNETIC DISK BY SUPERIMPOSING AN AC VOLTAGE ON A DC BIAS VOLTAGE

[75] Inventors: Tsutomu T. Yamashita, Milpitas; Kyou H. Lee, San Jose; Rajiv Y. Ranjan, San Jose; Yuri Trachuk, San Jose, all of Calif.

[73] Assignee: Komag, Incorporated, Milpitas, Calif.

[21] Appl. No.: 299,852

[22] Filed: Sep. 1, 1994

Related U.S. Application Data

[63] Continuation of Ser. No. 164,643, Dec. 8, 1993, abandoned, which is a continuation of Ser. No. 854,163, Mar. 20, 1992, abandoned.

[51] Int. Cl.$^6$ ................................................. C23C 14/34
[52] U.S. Cl. ................................ 204/192.15; 204/192.16; 204/192.2; 204/298.08
[58] Field of Search ..................... 204/298.08, 192.12, 204/192.16, 192.2, 192.15

[56] References Cited

U.S. PATENT DOCUMENTS

| | | | |
|---|---|---|---|
| 3,461,054 | 8/1969 | Vratney | 204/298.08 X |
| 4,713,288 | 12/1987 | Kokaku et al. | 204/192.16 X |
| 4,716,078 | 12/1987 | Kishine et al. | 204/192.2 X |
| 4,737,419 | 4/1988 | Hilden et al. | 204/192.16 X |
| 4,778,582 | 10/1988 | Howard | 204/192.2 X |
| 4,786,564 | 11/1988 | Chen et al. | 428/694 |
| 4,869,797 | 9/1989 | Nagao et al. | 204/192.16 |
| 4,894,133 | 1/1990 | Hedguoth | 204/192.16 X |
| 4,981,566 | 1/1991 | Nurczinger | 204/298.08 X |
| 5,045,165 | 9/1991 | Yamashita | 204/192.2 X |

FOREIGN PATENT DOCUMENTS

| | | | |
|---|---|---|---|
| 0440259A2 | 8/1991 | European Pat. Off. | |
| 3801309 | 7/1989 | Germany | 204/298.08 |
| 0109164 | 5/1988 | Japan | 204/298.08 |

OTHER PUBLICATIONS

Annual Technical Conference Proceedings–Society of Vacuum Coaters, vol. 35, 22 Mar. 1992, Baltimore, Md., US pp. 391–394; Scholl R. A. "Process Improvements For Sputtering Carbon And Other Difficult Materials Using Combined A.C. and D.C. Process Power", pp. 392–393.

J. K. Howard, *"Thin films for magnetic recording technology: A review"*, Sep. 15, 1985, IBM Research Laboratory, pp. 1–13.

Francis K. King, *"Datapoint Thin Film Media"*, IEEE Transactions, Magnetics vol. Mag. 17, No. 4, Jul. 1981, pp. 1376–1379.

C. W. Chen et al., *"Surface-defect formation in graphite targets during magnetron sputtering"*, J. Vac. Sci. Technology, A8 (4), Jul./Aug. 1990, pp. 3157–3162.

(List continued on next page.)

Primary Examiner—Nam Nguyen
Attorney, Agent, or Firm—Skjerven, Morrill, MacPherson, Franklin & Friel

[57] ABSTRACT

A carbon film for protecting a magnetic disk is sputtered by a DC magnetron sputtering method, with the addition of superimposed AC power on the DC power applied to the carbon target. When the carbon film is sputtered for extended period in a production sputtering machine, nodular growth occurs over the sputtering surface of the carbon target. Such nodules are variously called "warts" or "mushrooms" in the industry and they are detrimental to the productivity of the sputtering machine. The size and quantity of the nodules over the target surface increase as the target is sputtered longer, and because these region do not contribute to sputtering, the efficiency of the target decreases. As sputter efficiency decreases, power input must be increased to the target to make up for the loss in the effective sputtering area of the target. Eventually, the power input must be increased to a point where arcing occurs continuously and sputtering cannot be continued. By superimposing AC power onto the DC power applied to the target, virtually all arcing on the carbon target is eliminated, thereby significantly reducing the nodular growth and extending the use of the target.

16 Claims, 14 Drawing Sheets

OTHER PUBLICATIONS

Diane S. Knight and William B. White, *"Characterization of diamond films by Raman spectroscopy"*, 1989 materials Research Society, J. Mater. Res., vol. 4, No. 2, Mar./Apr. 1989, pp. 385–393.

S. C. Sharma et al., *"Growth of diamond films and characterization by Raman, scanning electron microscopy, and x–ray photoelectron spectroscopy"*, 1990 Materials Research Society, J. Mater. Res., vol. 5, No. 11, Nov. 1990, pp. 2242–2432.

Hobart H. Willard, *"Instrumental Methods of Analysis, 6th Edition"*, Wadsworth Publishing Co., 1981, pp. 217–238.

John L. Vossen and Werner Kern, *"Thin Film Processes"*, RCA laboratories, Academic Press, Inc., 1978, pp. 11–73.

Robert K. Waits, *"Planar Magnetron Sputtering"*, Data Systems Division, Hewlett–Packard, Academic Press Inc., 1978, pp. 131–173.

METHOD OF SPUTTERING A CARBON PROTECTIVE FILM ON A MAGNETIC DISK BY SUPERIMPOSING AN AC VOLTAGE ON A DC BIAS VOLTAGE

This application is a continuation of application Ser. No. 08/164,643, filed Dec. 8, 1993, now abandoned, which was a continuation of application Ser. No. 07/854,163, filed Mar. 20, 1992, abandoned.

BACKGROUND OF THE INVENTION

This invention relates to a method of depositing carbon films which are used to protect magnetic media.

Metallic magnetic thin film disks used in memory applications typically comprise a substrate material which is coated with a magnetic alloy film which serves as the recording medium. Typically the recording medium used in such disks is a cobalt-based alloy such as CoNi, CoCr, CoCrNi, CoPt and CoNiPt which is deposited by vacuum sputtering as discussed by J. K. Howard in "Thin Films for Magnetic Recording Technology: A Review", published in Journal of Vacuum Science and Technology in January 1986, incorporated herein by reference.

Usually, it is necessary to protect such magnetic recording media by sputtering a protective overcoat such as a carbon overcoat. An example of such a sputtered carbon overcoat is described by F. K. King in "Datapoint Thin Film Media" published in IEEE Transactions on Magnetics in July 1981, incorporated herein by reference. It is also known to provide a carbon film containing hydrogen by sputtering the carbon film in the presence of a hydrogen-argon gas mixture as described in U.S. Pat. No. 5,045,165, issued to Yamashita and incorporated herein by reference.

Carbon targets used for sputtering of carbon films generally consist of nearly pure graphite. The targets are electrically conductive. The target materials are readily available from many vendors world wide.

Thin film magnetic disks are typically manufactured in a large inline sputtering machine as described in the U.S. Pat. No. 5,045,165. To increase productivity and reduce manufacturing costs, it is important to operate the sputtering machine continuously with high utilization. There are several factors which limit the continuous operation of the sputtering machine. First, the targets are eventually used up, and the machine must be opened to replace them. Second, the protective shields which direct the sputtered species to the substrate become coated, and this coating will eventually start to flake. Excessive flaking from the shields contributes to increased defects on the disk surface. Therefore, the shields must be periodically replaced and cleaned. The third factor is that the carbon target surface develops small nodular growths, generally known as "warts" or "mushrooms", during continuous sputtering operation. These nodules degrade the sputtering efficiency of the target. The nodules form over the region where the sputtering actually takes place on the target, and the region where the nodules form does not sputter. To make up for the loss in sputtering rate due to the nodules, the power input to the target must be increased to increase the sputtering rate from the target areas which are not yet covered by nodules. However, the power cannot be increased indefinitely because the cathode often becomes unstable at very high power. Target cooling also becomes a problem at high power input. Often, nodule formation on the carbon target forces an early shut down of sputtering machine, during which the sputtering machine is vented to air and the carbon target surface is cleaned to remove the nodules. Sometimes the target is replaced with a new target. The time needed to replace or clean the target results in a loss of utilization of the sputtering machine. Since the sputtering machine is typically the most expensive capital equipment used in making the disks, a loss of utilization adds to the cost of the disks.

Nodules are described by Chen et. al in "Surface-Defect Formation in Graphite Targets During Magnetron Sputtering", Journal of Vacuum Science and Technology July/August 1990, incorporated herein by reference. To date, the mechanism of nodule formation is not well understood, nor is there a satisfactory means of avoiding the nodules. It is generally believed that nodule formation is related to the purity of the carbon target, or to the placement geometry of the structures around the cathode, such as the ground shields around the cathode. We have found however, that nodules can form in many types of carbon targets regardless of their purity level. Cathode construction and geometry has some effect, but generally nodules form readily in most cathode types which we have studied. The nodules occur exclusively in DC magnetron sputtering of carbon. It is possible to sputter carbon by RF and RF/magnetron sputtering, but because the sputtering rate is much lower than that of DC magnetron sputtering, RF or RF/magnetron sputtering is generally not used in production machines. A higher sputtering rate translates to higher throughput for the disks, which increase the productivity of the sputtering machine.

During planar DC magnetron sputtering, sputtering occurs over a region where a magnetic and electric field from a magnet placed under the target is horizontal with respect to the target surface. Typically, this sputter region is a semi-circular area over the target surface, and it is commonly referred to as a "race-track" due to its shape. The construction of planar DC magnetron cathodes is described in a chapter by Robert K. Waits in *Thin Film Procsses*, edited by John L. Vossen and Werner Kern, Academic Press, Inc. (1978), incorporated herein by reference. The nodules form in the race-track. Typical nodules are anywhere from few millimeters in size, up to 1 to 2 cm across. The height of growth above the target surface can be many millimeters. Cross sectional analysis of the nodules reveal several key features as shown in FIG. 1. At the base, there is a region (21) of very hard and dense glassy material which forms beneath the original surface of target (22). X-ray diffraction analysis of the material in region (21) reveals it to be amorphous, as opposed to the target material which is crystalline graphite. The glassy material is electrically resistive. Above the glassy phase, nodular or whisker-like growth occurs. The nodular growths (23) are fairly delicate and can be easily blown away by strong blast of air. The nodular growths (23) are also amorphous as analyzed by X-ray diffraction.

In order to describe how and why the nodules form, some description of the sputtering process itself is desirable. Sputtering is achieved by placing the target in a low pressure argon atmosphere and applying a large negative bias voltage to the target. The target surface emits electrons into the argon. These electrons are accelerated by the bias voltage, and bombard the argon atoms. The argon atoms are then stripped of an electron and become positively ionized. At the target surface, the positively charged argon atoms accelerate toward the target which, as mentioned above, is negatively biased, and bombard the target surface, thereby ejecting from the target the material to be sputtered. Additional electrons can be ejected, called secondary electrons, from the target surface as a result of argon bombardment which then can ionize more argon atoms. The process becomes "self-sustaining", when a plasma of ionized argon atoms forms above the target surface. In a planar DC magnetron sputtering, the electrons are confined in a narrow area above the target surface by a magnetic field. The magnetic field causes electrons to take a longer helical path above the target, which increases the probability of further ionizing collisions with the argon atoms. The plasma thus formed is much denser than can be achieved by any other means, and it is possible to obtain very high sputtering rates.

One problem with DC sputtering is that if an insulating material deposits on the target surface, it can quickly develop a positive charge and prevent argon from bombarding it, so that it will not sputter. Worse yet, if the charge cannot be dissipated, then sufficiently high voltage can develop in the insulating material so that dielectric breakdown can occur. Large current can flow through the insulating material and the target in such a case, and it can damage the power supply and the target. Modern DC power supplies used for sputtering have features which suppress the damage that arcing can cause by momentarily shutting down the power to allow the charge to dissipate. One of the difficulties in the power supply design is the ability to distinguish large arcs which are damaging, from the smaller arcs which are not damaging. Generally, the power supplies will ignore arcing from localized dielectric breakdowns, and will shut down only in the event of more catastrophic arcing which is caused by flakes or larger metal shorting the target to ground. If the target itself is electrically conductive but the sputtered species is non-conductive, the situation becomes worse. This situation occurs in some reactive sputtering systems, where a metal target is sputtered in the presence of oxygen or nitrogen to produce metal oxides or nitrides. The sputtered film is usually nonconductive, and arcing can occur when the sputtered species backsputter onto the target surface and build up over the sputtering region of the target.

Backsputtering is a function of the material being sputtered, process pressure, geometry of the cathodes and power input.

Nodules are believed to form on carbon targets as follows: During sputtering, some local inhomogeneity or small foreign particle on the target surface causes local arcing to occur. The target is under large negative potential, and foreign particles or local inhomogeneities on the target surface which are insulating can develop a positive charge. If the build-up of charge is sufficiently large, dielectric breakdown can occur through the foreign particle or inhomogeneity and a large current can flow through it. Localized arcing apparently causes a very intense temperature rise, and the adjacent graphite transforms into hard glassy carbon. This hard glassy carbon is quite resistive and does not sputter as well as the surrounding graphite material. As sputtering is continued, a backsputtering process starts to deposit sputtered carbon above and around the glassy phase. This backsputtered carbon defines the nodule's characteristic whisker-like appearance. The backsputtered carbon film is generally quite resistive as well, so it does not resputter once it starts to grow on the carbon surface. Additional arcing can occur over the growth, and the process can repeat itself many times. Eventually, the whisker growth can take on a very complex shape as repeated arcing and growth takes place. Because the nodules form over the region where the sputtering occurs, overall sputtering efficiency (deposition rate divided by the target area) decreases as more target area is taken out of the sputtering process by the nodule formation.

In a typical continuous sputtering process, the substrate to be coated passes by the target during a fixed interval of time. When the sputtering efficiency decreases, the power density to the target is increased to make up for the loss. The smaller area available for sputtering combined with the power increase to the target increases the voltage developed at the target. A higher voltage causes a higher rate of arcing which in turn causes even more nodules to form. The intensity of arcing becomes larger as well, so that the power supply begins to detect it and starts to shut itself down to protect itself. Eventually the frequency of arcing becomes sufficiently high so that sputtering cannot be continued. At this point, the chamber must be opened and the target surface must be cleaned.

Sometimes the formation of nodules over the target surface is not evenly distributed. In such cases, the deposition uniformity over the disk surface becomes worse, and again the system must be opened to clean the target surface or replace it. The formation of nodules and subsequent additional arcing can cause pieces of nodules to fly off the target surface and deposit on the disk surface. This causes parts of the disk to have no protective carbon coating, and it is detrimental to the performance of the disk. If the carbon target surface is scraped clean of all the nodules, then the target can be returned to its original condition.

It is known that deposition of carbon in the presence of a large amount of hydrogen improves the wear resistance of the carbon film, as described in U.S. Pat. No. 5,045,165. In such a process, the deposited film has electrical resistivity which is much larger than a film deposited without the hydrogen. In the '165 patent, it is stated that the electrical resistivity of a 300 Å thick film increased from 500 $\Omega$/square to more than 20 M$\Omega$/square by adding hydrogen during sputtering. During carbon deposition using hydrogen, the frequency of arcing and the amount of nodules forming over the target dramatically increases. This is presumably because the backsputtered species which starts to redeposit on the target is much more electrically resistive, and this leads to more arcing. Therefore, in order to deposit a hydrogenated carbon film efficiently and productively during manufacturing, arcing must be suppressed and nodule formation prevented.

There are other sputtering methods which are less sensitive to the effect of an insulating layer on the target surface. RF sputtering can sputter insulators without causing arcing, and this largely eliminates the formation and growth of nodules on carbon target surfaces. RF sputtering is described in the chapter by J. L. Vossen and J. J. Cuomo in the above-mentioned *Thin Film Processes*, incorporated herein by reference. The oscillation frequency used in typical RF sputtering is between 5 and 30 MHz. The industry standard is generally 13.56 MHz. In RF sputtering, the electrons in the glow space oscillate with sufficiently high energy to produce ionization of argon atoms without depending on the secondary electrons. Because the RF voltage can be coupled through any kind of impedance, it is possible to sputter literally any kind of material, including insulators. One key disadvantage of RF sputtering is that a complex matching network must be provided close to the cathode to match the output impedance of the generators, which is typically 50 $\Omega$. Furthermore, the sputter rate of carbon by RF sputtering is many times lower than by DC magnetron sputtering. Because RF sputtering generates plasma at some distance away from the target and nearer to the substrate, there is substantially more chance of substrate heating by electron bombardment compared to DC magnetron sputtering at a comparable power input. The sputter rate can be increased by supplying RF to the magnetron cathode in which case the sputtering is called RF/magnetron sputtering. The rate can be increased, but not to the level that can be achieved with DC magnetron sputtering, and the matching network is still needed. Also, film uniformity is generally much more difficult to achieve with RF/Magnetron sputtering method. (see page 164, Vossen and Kern).

Alternatively, low frequency RF sputtering in the range of several hundred kilohertz can be used. This greatly simplifies the matching network but the sputter rate is still low so it is not practical.

Pulsed DC sputtering is another method of deposition which attempts to alleviate the problem of arcing. It is often used in reactive sputtering systems. Pulsed DC sputtering uses short pulses of DC voltage separated by short intervals during which the cathode voltage goes to zero. During the "off" period, the charge on any insulating material that developed over the target is allowed to dissipate, thereby preventing catastrophic arcing. Pulsed DC sputtering does not prevent the insulating material from depositing on the target surface in the first place, so eventually the target must be replaced or cleaned.

SUMMARY OF THE INVENTION

We have discovered that by superimposing an AC voltage (for example, 450 KHz) onto the DC voltage applied to the sputtering target during the deposition of a carbon film, arcing is almost completely eliminated during sputtering so that the formation of nodules is drastically reduced. This allows a much more extended and continuous sputtering of carbon and increases the productivity of the sputtering machine. Just enough AC voltage is superimposed to prevent the arcing. In one embodiment, the frequency of the AC voltage is between 300 and 500 KHz, but a frequency in the range of 100–1000 KHz is believed to be operable. In order to superimpose the AC voltage, suitable filters must be used to prevent the AC current from entering into the DC power supply. The electrical block diagram needed to achieve the combination of DC and AC power is illustrated in FIG. 2. Because the frequency of the AC is substantially lower than that of conventional RF sputtering, the need for complex impedance matching is obviated, thereby simplifying the sputtering operation and control.

The AC superimposition is particularly useful for sputtering hydrogenated carbon film, where arcing and nodule formation are especially prevalent.

DETAILED DESCRIPTION

Figure 3:
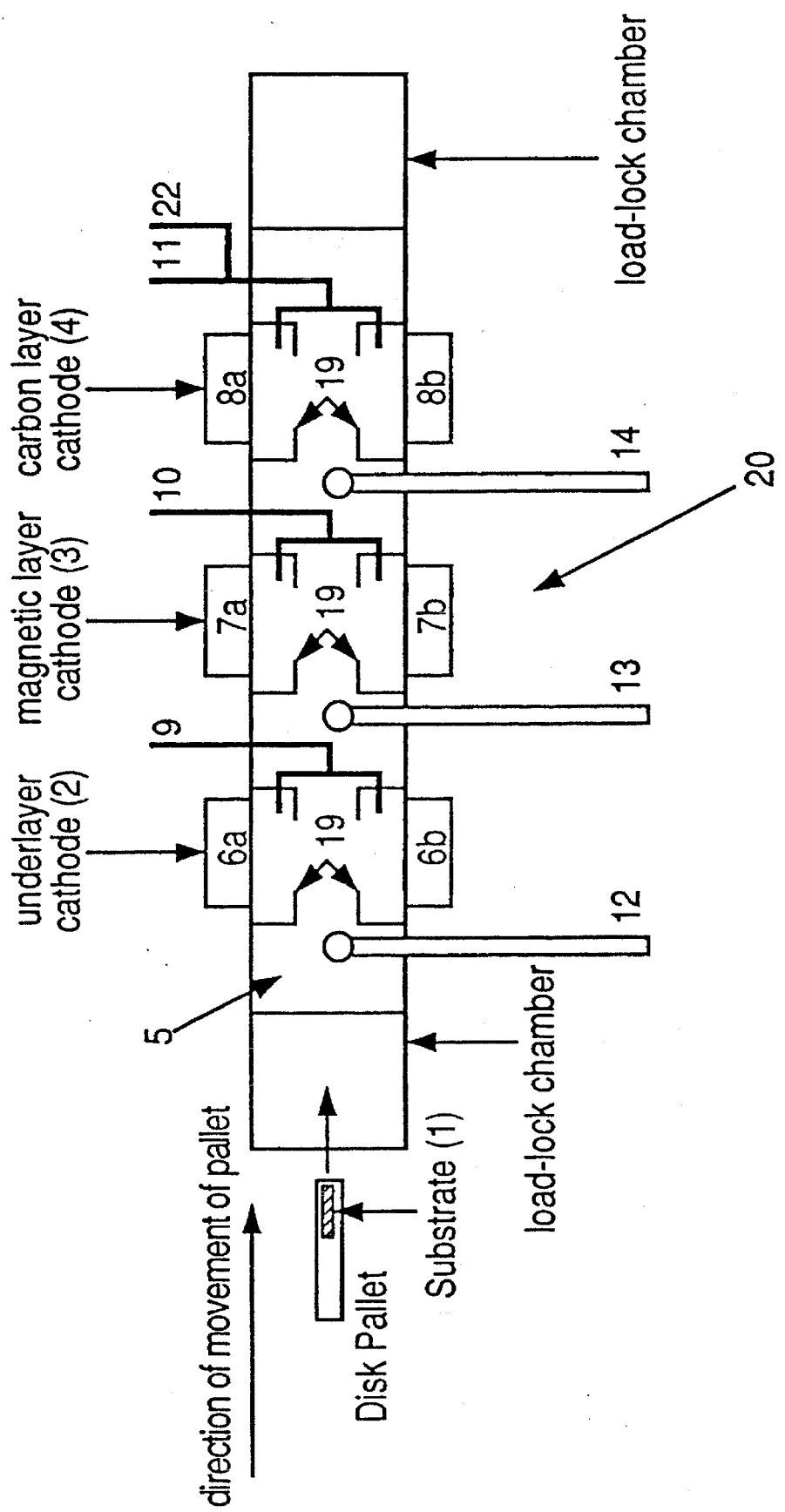
FIG. 3 schematically illustrates a typical in-line sputtering system used to make thin film media.
Figure 4:
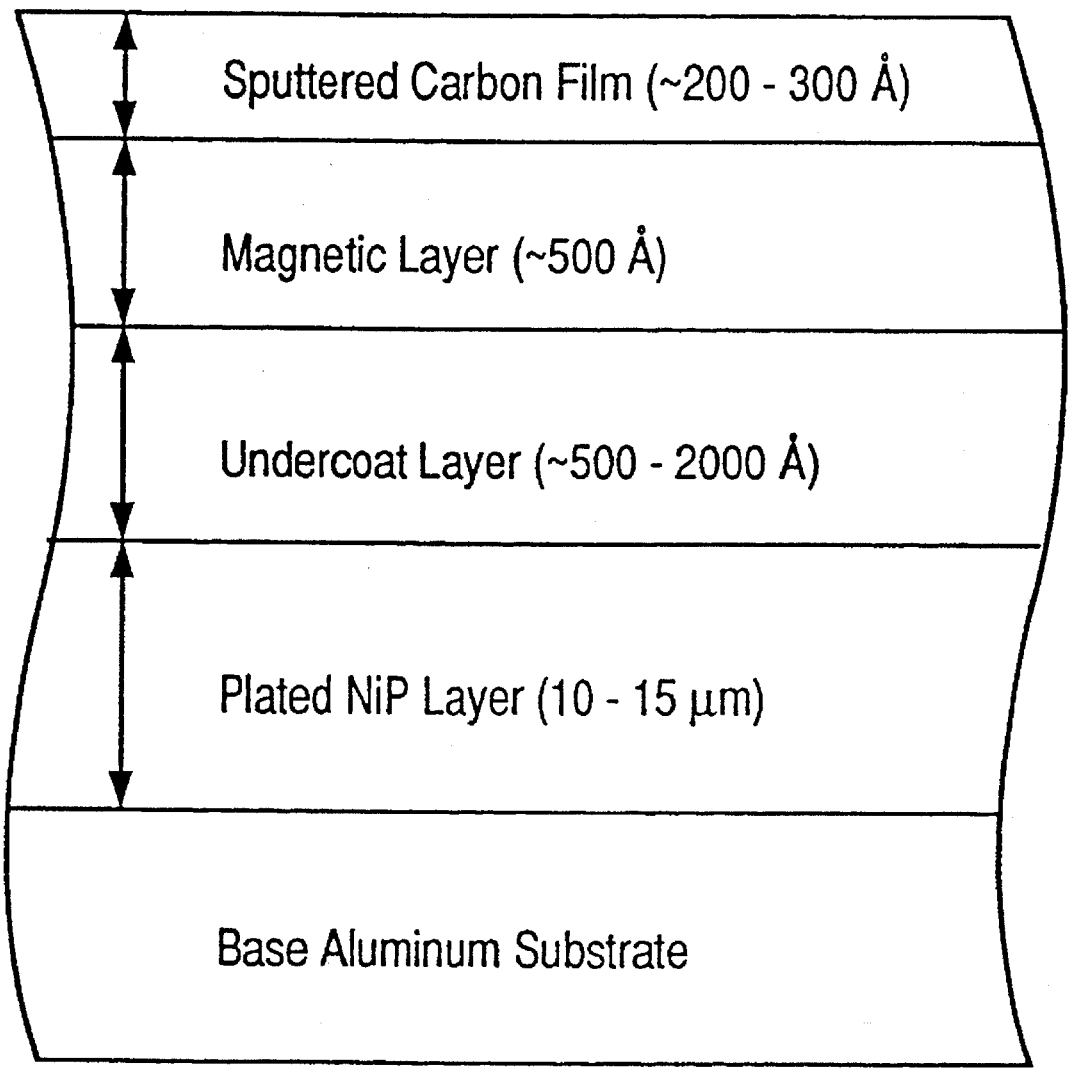
FIG. 4 illustrates in cross section the structure of a typical thin film medium.

FIG. 3 schematically illustrates sputtering apparatus typically used in accordance with the invention. A substrate (1) used to manufacture a magnetic disk is typically aluminum, plated on both sides with a nickel phosphorus alloy. Substrate (1) is placed on a pallet, which moves past a set of targets at constant speed. A first pair of targets (6a, 6b) are used to form an undercoat, which may be Cr or an $Ni_xP$ alloy, as described by Chen et. al. in U.S. Pat. No. 4,786,564, incorporated herein by reference. A second target pair (7a, 7b) are a cobalt alloy, and a third target pair (8a, 8b) are carbon (graphite). Each cathode has a process gas inlet (9, 10, 11), and the gas is typically argon. In one embodiment, hydrogen gas mixed with argon may be introduced at the carbon cathode through inlet (22), as described by Yamashita in U.S. Pat. No. 5,015,165. FIG. 4 illustrates in cross section a magnetic disk formed with the apparatus of FIG. 3.

Figure 5:
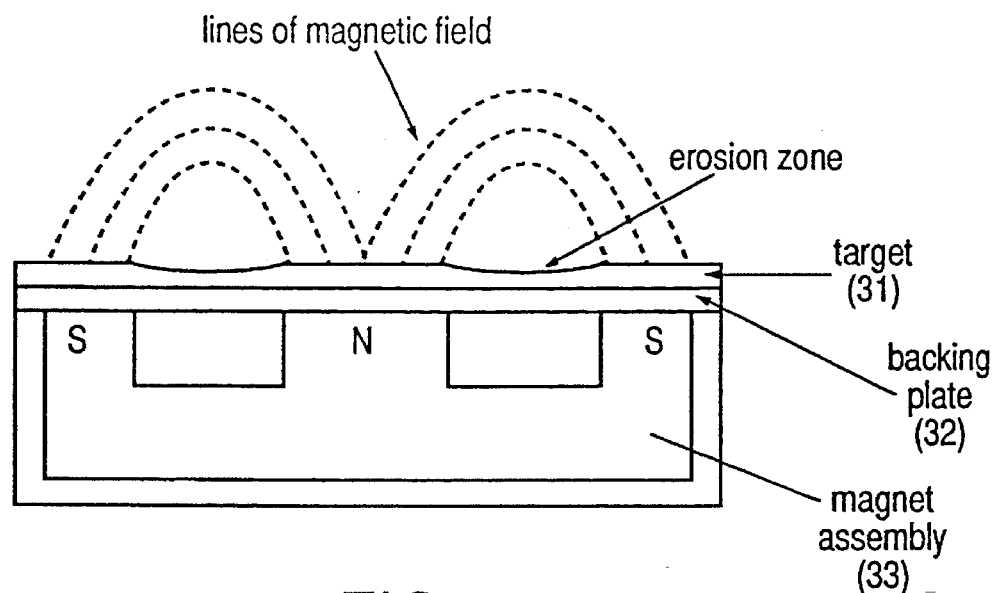
FIG. 5 illustrates a cross sectional view of a typical planar DC magnetron cathode.
Figure 6:
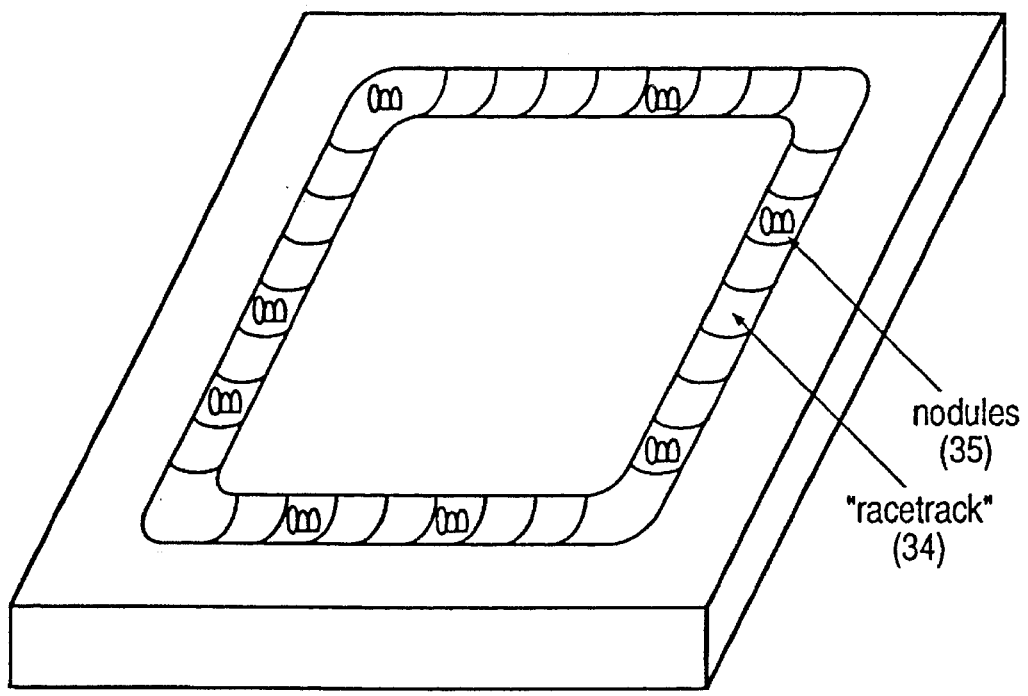
FIG. 6 is a schematic representation of the target surface of a planar DC magnetron cathode, showing the "racetrack" where sputtering (and nodule formation) take place.

Typical sputtering targets are rectangular in shape, and in this case the targets measure 10 inches wide by 25 inches in length. (Alternatively, the targets may be circular.) The construction of a DC magnetron cathode used for sputtering carbon is illustrated in FIG. 5. Target (31) is attached to a backing plate (32), which is bolted to a cathode assembly. Behind the target is a magnet assembly (33) which defines the region where sputtering is to occur on the target surface. Typically, as shown in FIG. 6, the sputtering takes place in an oval band region (34), herein referred to as a "racetrack". Nodules (35) form inside the racetrack.

Figure 7:
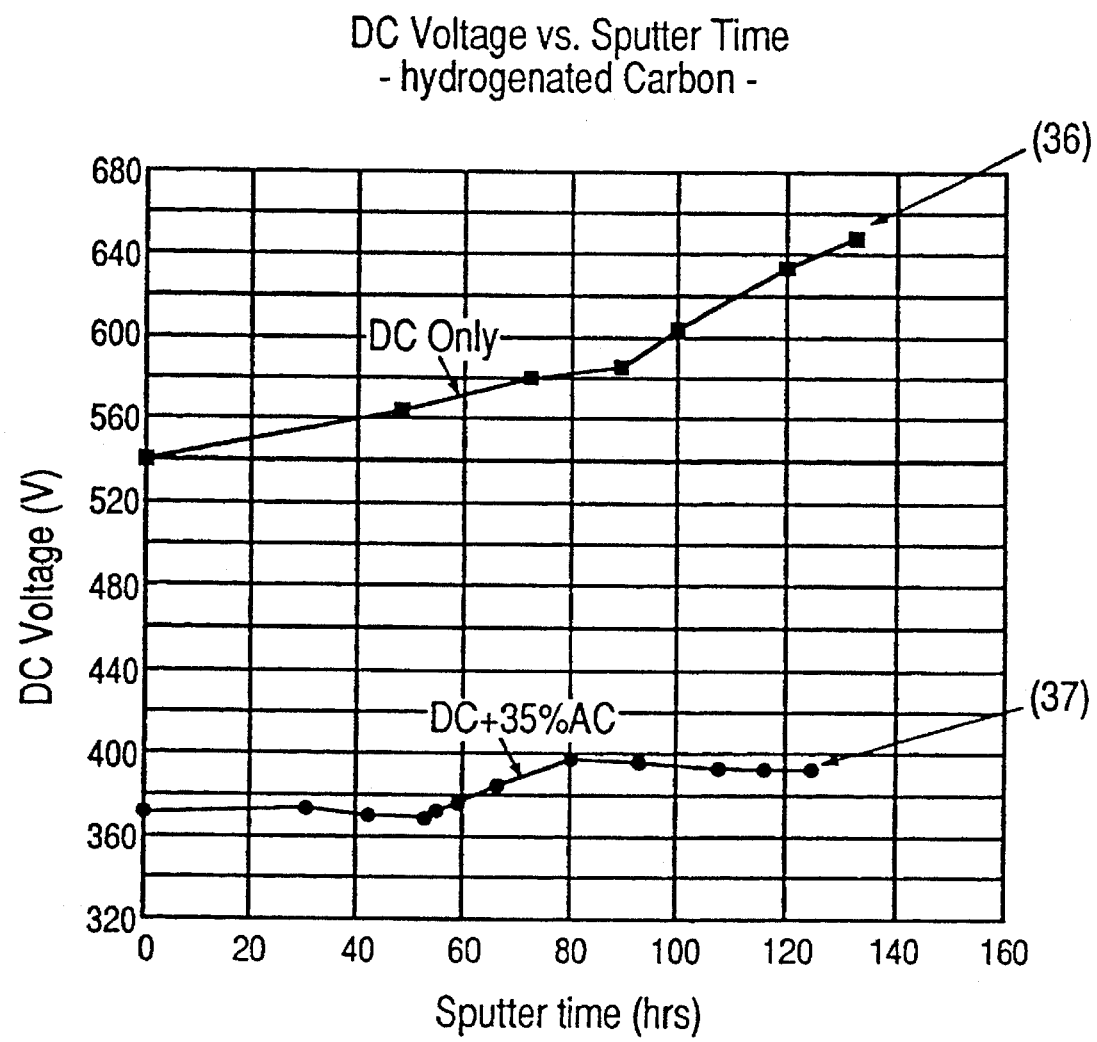
FIG. 7 is a graph of DC voltage vs. time for a typical DC magnetron and for a magnetron using an AC voltage superimposed on a DC voltage.

The relationship of cathode voltage to sputter time for the deposition of a hydrogenated carbon film by planar DC magnetron sputtering in accordance with the prior art is illustrated by curve (36) in FIG. 7. The data shown in FIG. 7 are for sputtering in a 20% $H_2$/80% Ar atmosphere (by volume). The pressure in the sputtering chamber was 6 mTorr, which is typical for a sputtering process, and it could be varied from about 1 mTorr to about 10 mTorr. The process gas flow rate was about 60 SCCM. The process of this invention is also applicable to pure Ar as well as to a mixture of Ar and hydrogen-liberating gases such as $CH_4$ and $C_2H_6$.

During the entire time shown in the plot of FIG. 7, which represents a period of five days of continuous deposition, the thickness of the carbon film on the disks when finished is maintained at 300 Å. As the target is used up, it can be seen that the voltage level must be increased continuously from 540 volts to 650 volts. This is done in order to maintain the same deposition rate, and the increase in power input is due to the loss in deposition efficiency from the formation of the nodules. At the end of the five days, the sputtering was shut down due to excessive arcing events on the target, which prevented further increases in the power.

Figure 8:
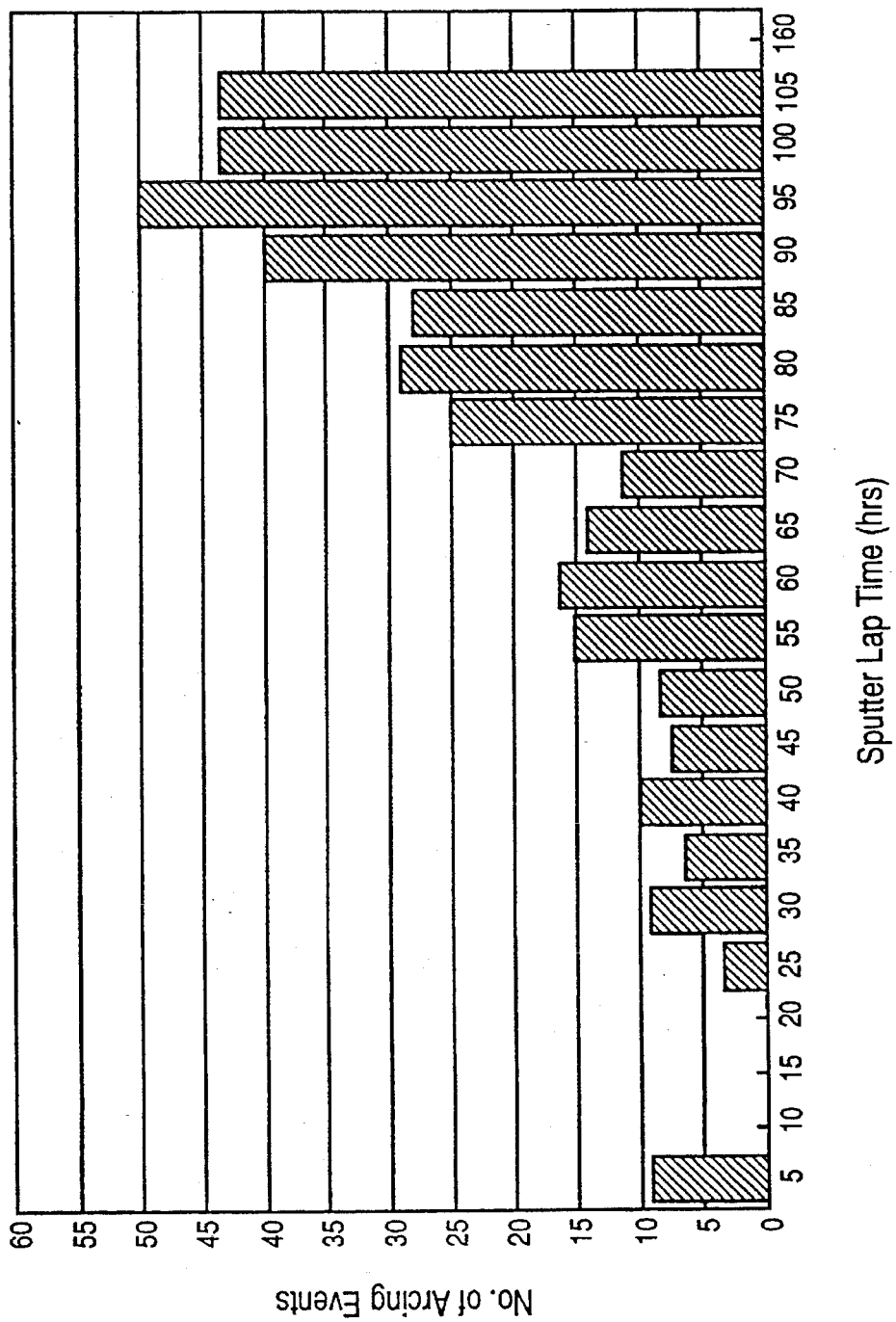
FIG. 8 is a graph indicating the frequency of catastrophic arcing events on a carbon target as a function of time in a DC magnetron.

FIG. 8 is a chart indicating the frequency of catastrophic arcing events on the target over a similar time interval. Initially, arcing takes place at a fairly high frequency. This is due to the fact that a typical target surface has various amounts of inhomogeneities, and dust particles, absorbed gases, etc., which initiate the arcing process. At this point, nodule growth has presumably already started. It should be noted that arc events registered in FIG. 8 are those of high enough intensity to shut down the DC power. Smaller events are not registered and they are presumably more frequent, but their frequency should be proportional to the more intense events which shut down the power. After the initial few hours, the frequency of arcing decreases to nearly zero, and this is maintained for several days into the sputtering. Then the arcing begins to increase in frequency and finally the frequency becomes so high that sputtering cannot be continued.

Figure 1:
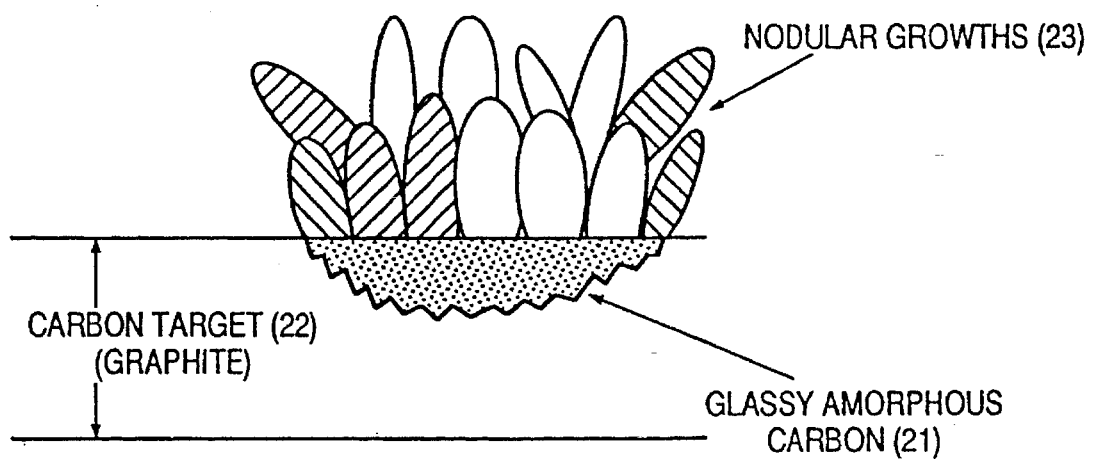
FIG. 1 illustrates schematically a cross section of the structure of a "nodule" which develops over the surface of a carbon target as it is continuously sputtered.
Figure 2:
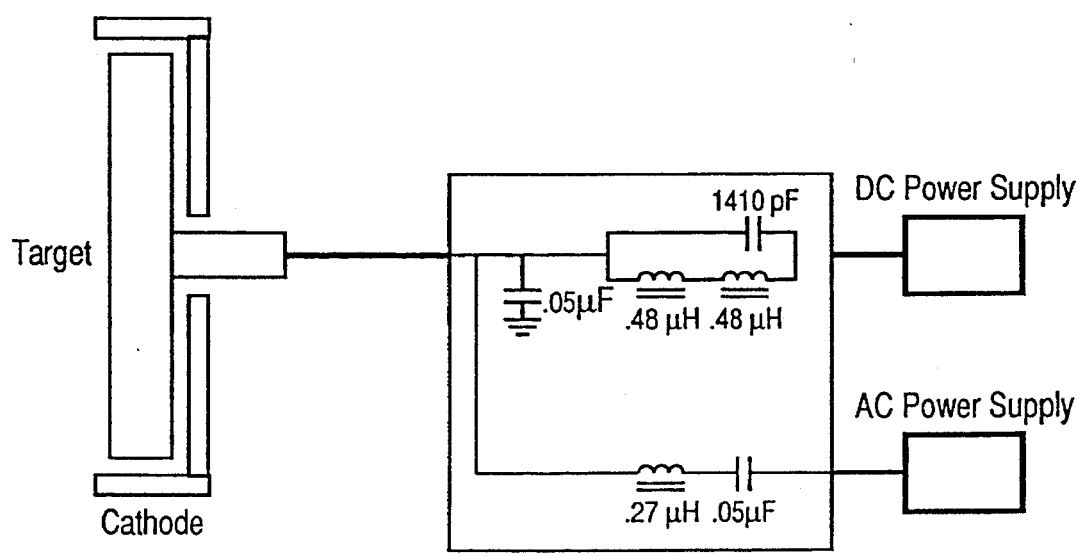
FIG. 2 is a schematic diagram of the circuitry required to superimpose an AC voltage onto a DC voltage for sputtering in accordance with the method of this invention.

The circuitry used to superimpose AC power onto DC power is shown in FIG. 2. Two separate power supplies are needed for each cathode: a conventional DC power supply, and a medium frequency AC power supply, with frequency in the range of 300 to 500 KHz, and typically about 400 KHz. The output voltages from the two power supplies are delivered to a "combiner". The DC output voltage passes through an LC filter which prevents the AC voltage from feeding back into the DC power supply. AC power is capacitively coupled into the cathode. The values of the capacitors and inductances shown in FIG. 2 are illustrative only.

Figure 9:
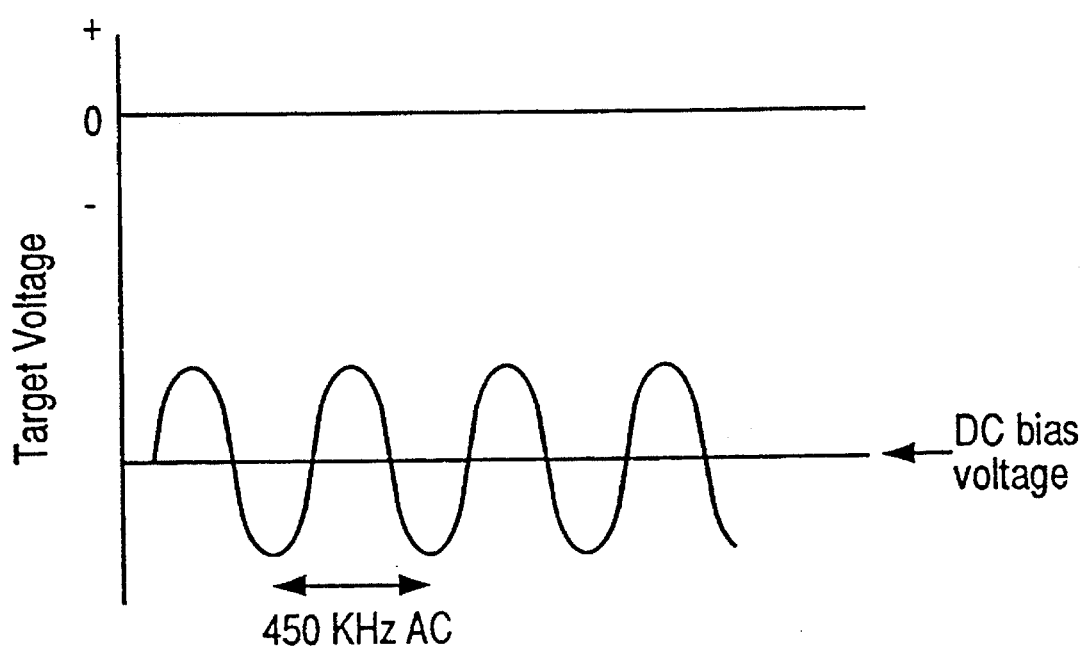
FIG. 9 is a representation of the output voltage from a combined AC/DC power supply.

The output voltages are schematically illustrated in FIG. 9. The 450 KHz AC voltage from the AC power supply is superimposed on the DC voltage from the DC power supply. The proportional amount of AC power superimposed on the DC power can be adjusted. (As used herein, "percentage AC power" means the amount of AC power as a percentage of the amount of DC power. For example, 30% AC power means that if DC power input was 2 KW, the AC power is 600 KW superimposed on the 2 KW of DC.)

Figure 10:
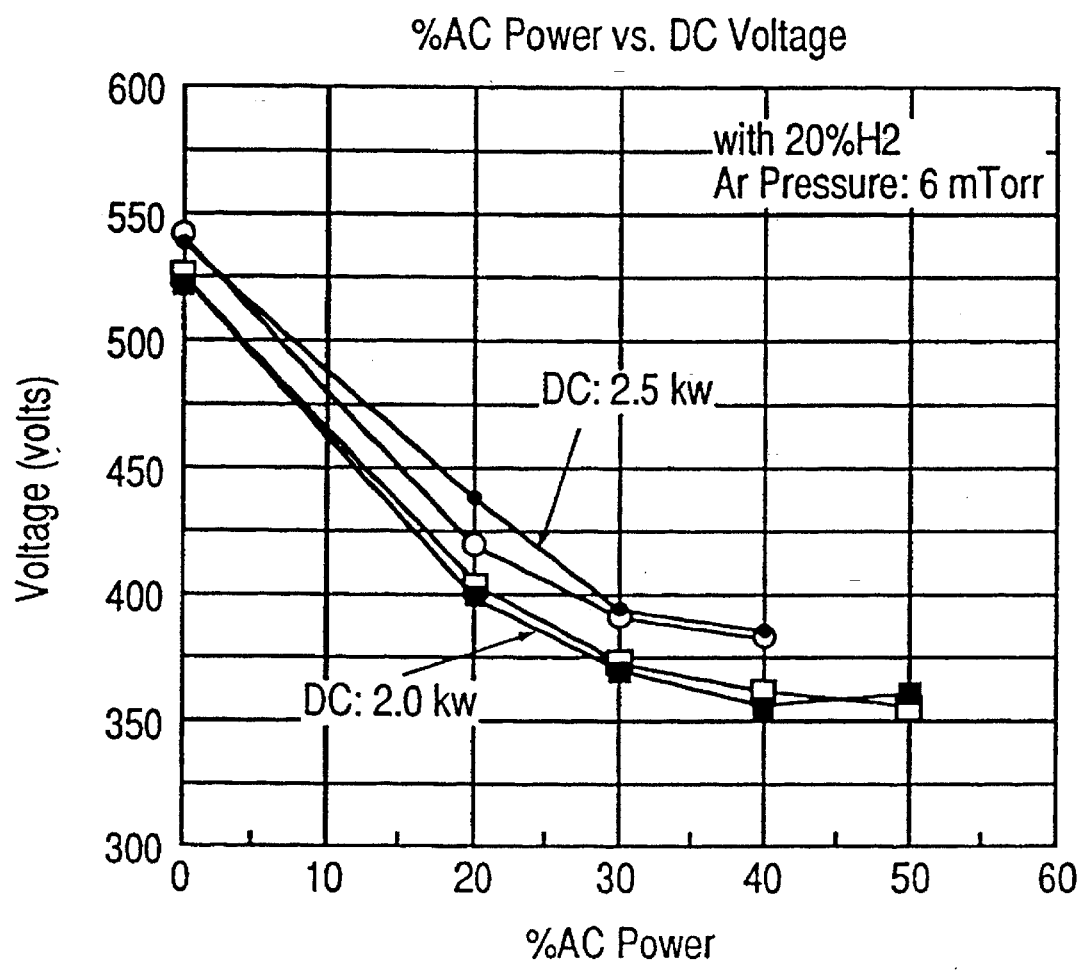
FIG. 10 is a graph of DC voltage versus percentage AC power superimposition for carbon sputtering in a gaseous mixture of 20% hydrogen/80% argon at a pressure of 6 mTorr.

By adding the AC power to the target, the target impedance is lowered. This is clearly shown in FIG. 10, which shows target DC voltage as a function of percentage AC power, with the DC power maintained constant, i.e., AC power is adjusted as a percentage of input DC power. As the AC power level is increased, the DC bias voltage on the cathode steadily decreases. Part of the arcing suppression comes from the fact that cathode impedance drops, which lowers the target voltage. As more and more AC power is added, the sputtering rate drops due to lowered target voltage. Sputtering is possible with AC power only, but this situation is similar to conventional RF sputtering with 13.56 MHz oscillations. The sputtering rate is significantly lower for AC sputtering, so that it would not be practical for a normal production environment. It is also possible to combine high frequency (13.56 MHz) RF with the DC power, but in this case a complex matching network is needed. Moreover, it is difficult to obtain a stable plasma with superimposed high-frequency RF. Therefore it is deemed not practical from the viewpoint of manufacturability.

At around 30 to 40% AC power, arcing is significantly reduced. In a test over a five day period of nearly continuous sputtering, essentially all the arcing (of the kind that shuts down the power supply) was suppressed. After the five days of sputtering the carbon target, the surface of the target was examined, and the nodule density was significantly reduced. The DC voltage was monitored throughout the time, and it is plotted (curve 37) in FIG. 7. It can be seen that there was minimal change in the target voltage during the entire time. For DC only sputtering (curve 36), there was more than a 20% increase in target voltage, while with AC power superimposed, the increase was only about 5%.

It is believed that significant nodule reduction will be achieved at a percentage AC power in the range of 30–60% and some benefits will be obtained in the range of 20–80%.

Figure 11:
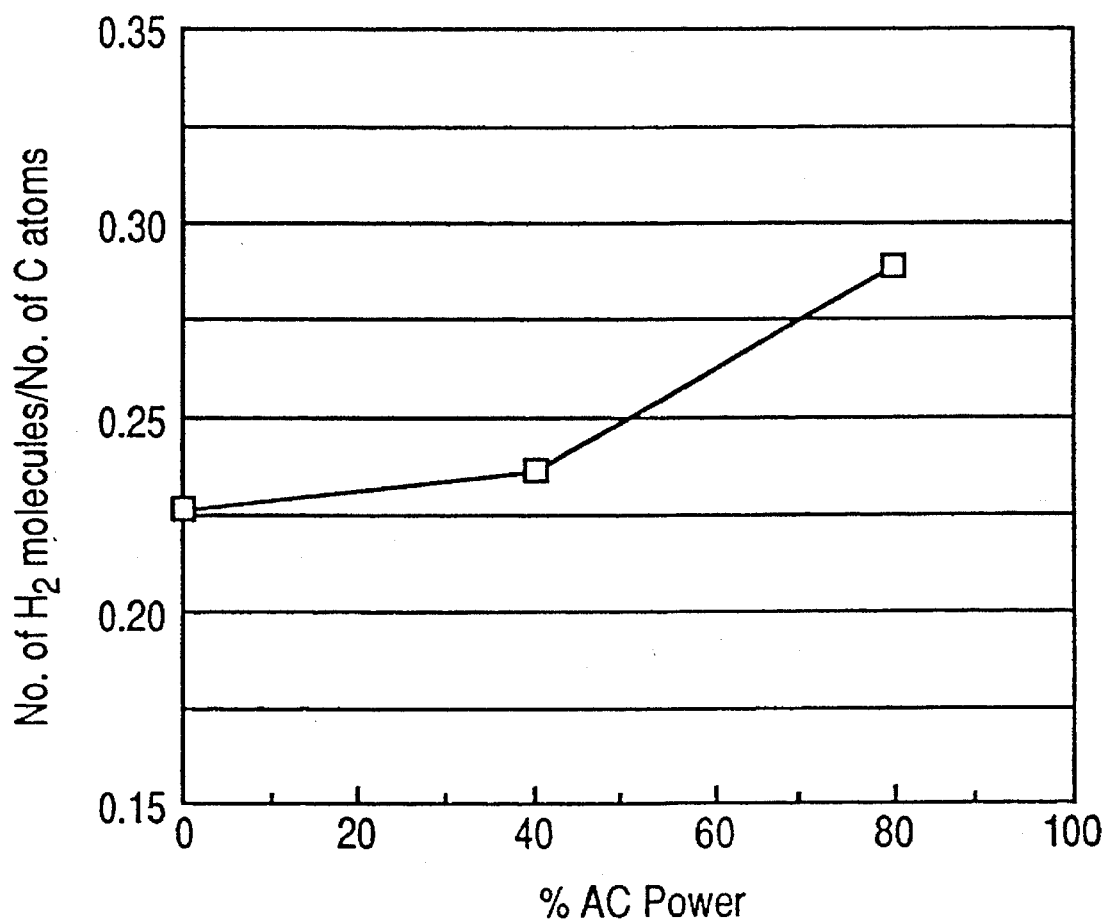
FIG. 11 is a SIMS (secondary ion mass spectroscopy) analysis of the hydrogen content of the carbon film as a function of percentage AC power superimposition.

The structure and chemical composition of the carbon film with and without the AC power superimposed were measured. FIG. 11 shows a SIMS (secondary ion mass spectroscopy) measurement of the hydrogen content in the film as a function of percentage AC power. The film thickness was maintained at 300 Å and sputtered in a 20% $H_2$/80% Ar mixture. FIG. 11 shows that increasing the percentage AC power increases the amount of hydrogen incorporated in the film.

Figure 12:
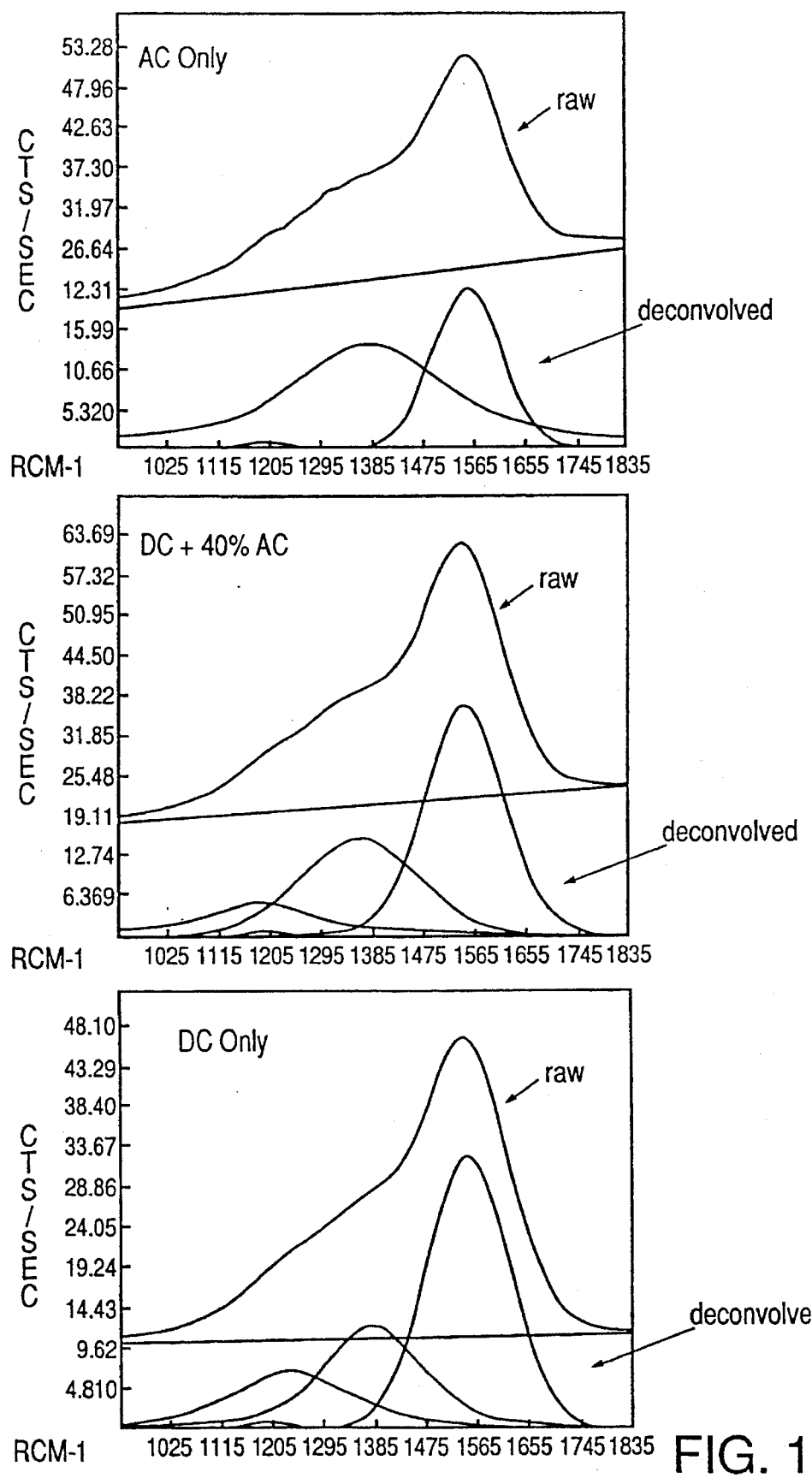
FIG. 12 are Raman spectra of three carbon films made with AC power only, with DC plus 40% AC power and with pure DC power. Plotted above each figure is a raw Raman spectrum, and below is a deconvolved spectrum.
Figure 13:
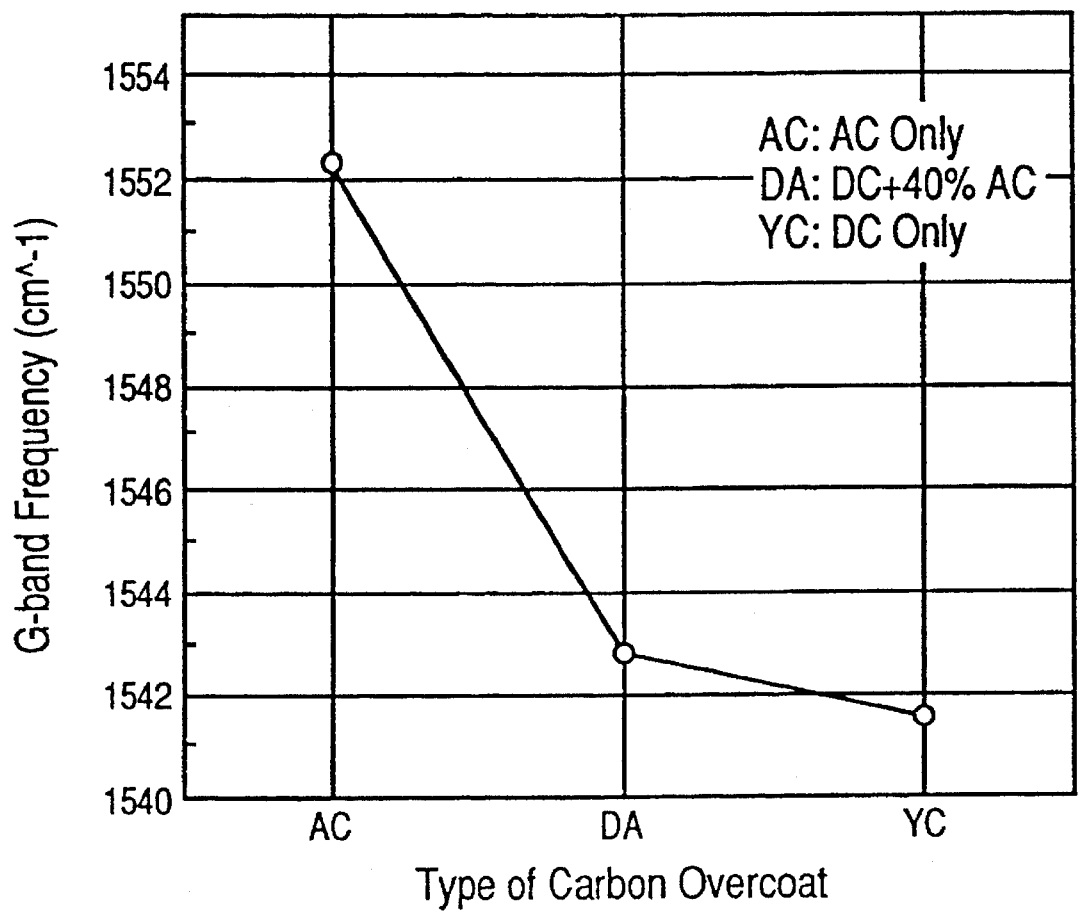
FIG. 13 is a plot of the position of the G band maxima in the Raman spectra as a function of sputtering condition, with pure AC power, 40% AC power, and pure DC power.
Figure 14:
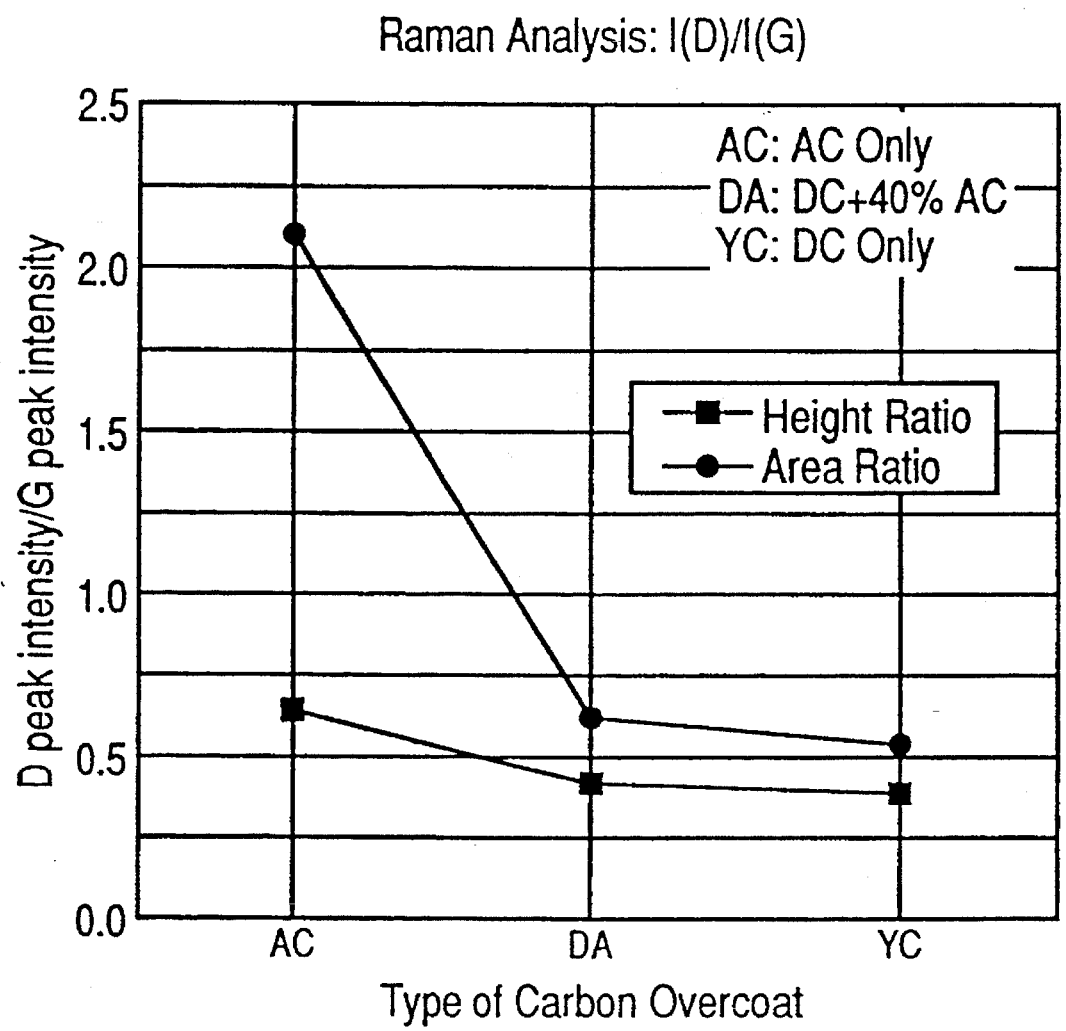
FIG. 14 is a plot of the ratio of D band and G band intensity in the Raman spectra as a function of sputtering condition, with pure AC power, 40% AC power, and pure DC power.

Raman spectra of the films with AC power only, DC power plus 40% AC power and DC power only are shown in FIG. 12. Raman spectra are discussed by D. S. Knight in "Characterization of diamond films", J. Mater. Rev., Vol. 2 (March–April 1989) and Willard et al., Instrumental Methods of Analysis, 6th Edition, Wadsworth Publishing Co. (1981), each incorporated herein by reference. The spectrum shown above in each plot in FIG. 12 is the raw Raman spectrum, and the curve shown immediately below is the deconvolved spectrum. Raman spectra are sensitive to the chemical structure of the film, and their application to analysis of carbon films is also discussed in U.S. Pat. No. 5,045,165 to Yamashita. FIG. 13 shows the position of the G peak as a function of sputtering condition. The results in FIGS. 12 and 13 can be interpreted as follows: The shift in the G peak to a higher frequency with increasing percentage AC power is seen, and this corresponds to less sp3 bonding in the film. FIG. 14 shows the ratio of the D peak intensity to the G peak intensity. It can be seen that the carbon sputtered with pure AC power has a higher D peak intensity. A higher D peak intensity is associated with greater crystallinity in the film, and this film more closely resembles the type of carbon sputtered without the presence of hydrogen.

Figure 15:
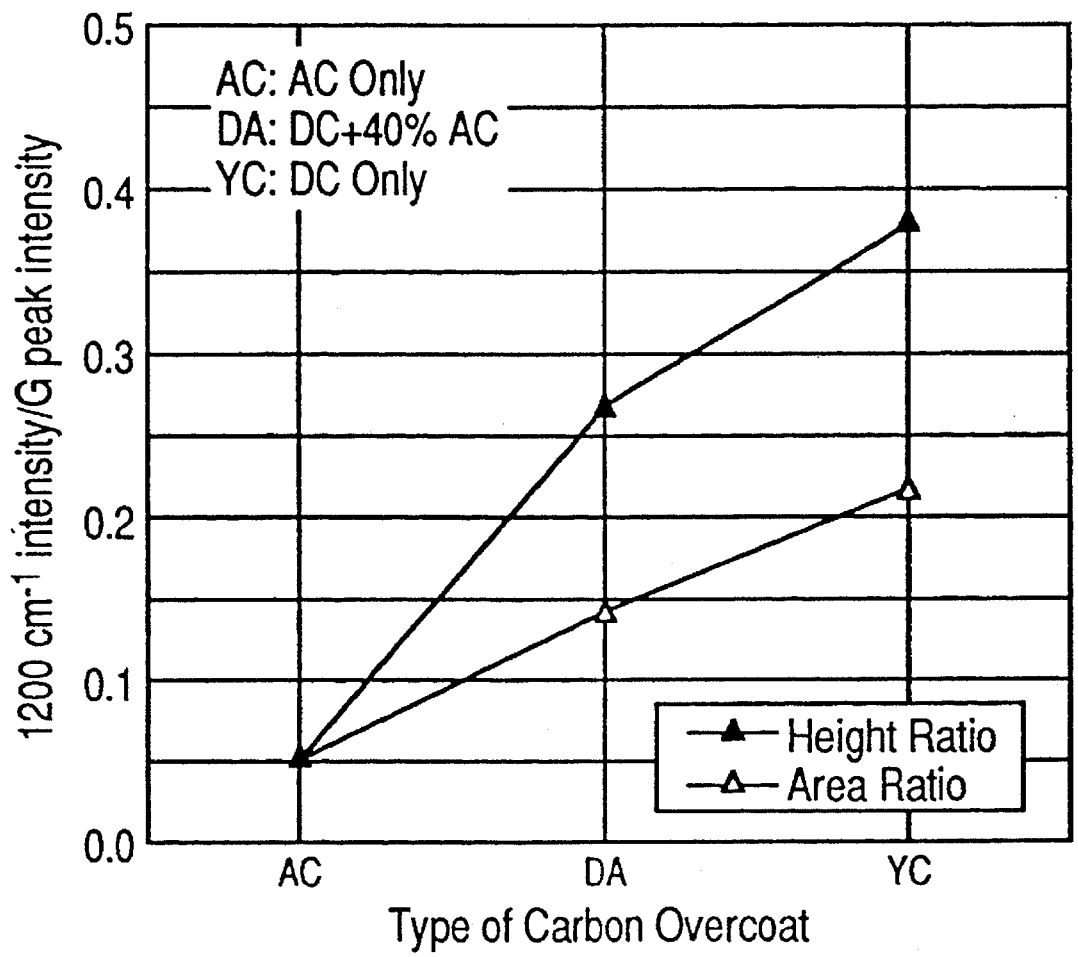
FIG. 15 is a plot of the ratio of the 1200 cm$^{-1}$ peak intensity and the G peak intensity as a function of sputtering condition, with pure AC power, 40% AC power, and pure DC power.

In order to deconvolve the Raman spectra, a third peak at around 1200 $cm^{-1}$ had to be used. It is a very broad peak, and it is more prominent in films deposited with only DC voltage. FIG. 15 shows the intensity of the 1200 $cm^{-1}$ peak as a function of percentage AC power. The origin of this peak is not well understood. The literature on the Raman spectroscopy of carbon films mentions a peak at 1133 $cm^{-1}$ which is associated with the effect of crystallite size or disorder in the sp3 carbon network, as described in pp. 2426 of "Growth of diamond films and characterization by Raman, scanning electron microscopy, and x-ray photoelectron spectroscopy" by S. C. Sharma et al., published in the Journal of Materials Research in 1990. The interpretation of Raman spectra is somewhat qualitative and in this instance it can only be said that AC superimposition does change the chemical nature of the carbon. It appears from the results that increasing the percentage AC power tends to change the chemistry in such a way that the changes introduced by the addition of hydrogen to the atmosphere are reduced. The direction is toward the chemistry of non-hydrogenated carbon. This is in spite of the fact that the film itself seems to contain more hydrogen as the AC superimposition is increased. The reason is still unknown. Since it is known that hydrogenation improves the mechanical performance of the carbon films, any changes in chemistry toward less hydrogenation are probably detrimental to the CSS (contact start-stop) performance of the film. From this perspective, it would appear that the amount of AC superimposition should be limited.

Contact start stop testing (CSS) was performed on the disks with the percentage AC power varying from 0 to 100%. No significant difference was detected between the samples. Therefore, even though there are definite changes in the carbon structure as a function of percentage AC power as seen by Raman spectroscopy, the CSS testing was not able to detect it. (During CSS testing, a carbon-coated disk was repeatedly rotated from a resting position to a rotational velocity of 300 revolutions per minute. A read/write head was pushed against the carbon-coated disk with a force of 9 grams. The lateral friction force exerted by the disk on the read/write head was measured during the CSS test. An increase in friction measured during the CSS test generally means the protective carbon film is wearing out. CSS tests are described in U.S. Pat. No. 5,065,165.)

Typically, CSS test results depend more on such factors as the surface roughness (texture) of the substrate, the condition and thickness of the lubricant, and the recording head which is used. It is possible that subtle changes in chemistry caused by AC superimposition cannot be detected easily in CSS tests. Therefore, it appears that there is some latitude in the range of AC power that can be superimposed to maintain the same CSS performance. This means that the percentage of AC to be superimposed can be decided on the basis of arcing suppression and sputter rate. Typical values which work for the target studied here are between 30–60%. In this range, the arcs are all but completely eliminated, and a sufficient sputtering rate is still obtained. Other settings can be used depending upon the total DC power applied, geometry of the cathode and the deposition conditions.

While the invention has been described in accordance with various embodiments, those skilled in the art will appreciate that modifications can be made without departing from the spirit and scope of the invention. For example, the present invention can be used to sputter carbon films on structures other than magnetic recording media. Accordingly, all such modifications came within the scope of the present invention.

What we claim is as follows:

1. A method of sputtering a carbon film comprising the step of applying DC power to a target, said target comprising substantially elemental carbon, and superimposing AC power on the DC power so as to inhibit the formation of nodules on the surface of said target.

2. The method of claim 1 wherein the amount of AC power superimposed on the DC power is between 20% and 80% of the amount of DC power applied to the target.

3. The method of claim 2 wherein the amount of AC power superimposed on the DC power is between 30% and 60% of the amount of DC power applied to the target.

4. The method of claim 1 wherein the AC power is in the form of a signal having a frequency between 100 KHz and 1000 KHz.

5. The method of claim 4 wherein the AC power is in the form of a signal having a frequency between 300 KHz and 500 KHz.

6. The method of claim 5 wherein the AC power is in the form of a signal having a frequency of about 400 KHz.

7. The method of claim 1 wherein said sputtering is performed in an atmosphere comprising hydrogen or a hydrogen liberating gas selected from a group consisting of $CH_4$ or $C_2H_6$.

8. The method of claim 7 wherein said sputtering is performed in an atmosphere comprising at least 20% hydrogen by volume.

9. The method of claim 1 wherein said target comprises substantially graphite.

10. The method of claim 1 wherein said target comprises crystalline graphite.

11. A method of fabricating a magnetic disk comprising the steps of:
    providing a substrate;
    depositing a magnetic layer; and
    depositing a protective carbon film over said magnetic layer, said protective carbon film being deposited by a sputtering process, said sputtering process comprising applying DC power to a carbon target and superimposing AC power on the DC power so as to inhibit the formation of nodules on the surface of said carbon target.

12. The method of claim 11 further comprising depositing an undercoat layer under said magnetic layer.

13. The method of claim 12 wherein said substrate comprises aluminum.

14. The method of claim 13 further comprising depositing a NiP layer between said substrate and said undercoat layer.

15. A method of inhibiting the growth of nodules on a target in a sputtering process, said target comprising substantially pure carbon, said method comprising the steps of:
    applying a DC voltage to said carbon target thereby causing said carbon target to function as a cathode;
    superimposing an AC signal on said DC voltage and applying said AC signal to said carbon target, said AC signal having a frequency of from 300 KHz to 500 KHz.

16. The method of claim 15 wherein said AC signal functions to limit the occurrence of arcing events at said target.

* * * * *